United States Patent
Guepratte et al.

(10) Patent No.: US 9,985,617 B2
(45) Date of Patent: May 29, 2018

(54) CIRCUIT FOR GENERATING AT LEAST TWO RECTANGULAR SIGNALS WITH ADJUSTABLE PHASE SHIFT AND USE OF SAID CIRCUIT

(71) Applicant: THALES, Courbevoie (FR)

(72) Inventors: Kevin Guepratte, Brest (FR); David Le Bars, Brest (FR); Hervé Stephan, Brest (FR)

(73) Assignee: THALES, Courbevoie (FR)

(*) Notice: Subject to any disclaimer, the term of this patent is extended or adjusted under 35 U.S.C. 154(b) by 162 days.

(21) Appl. No.: 15/107,433

(22) PCT Filed: Dec. 15, 2014

(86) PCT No.: PCT/EP2014/077723
§ 371 (c)(1),
(2) Date: Jun. 22, 2016

(87) PCT Pub. No.: WO2015/101475
PCT Pub. Date: Jul. 9, 2015

(65) Prior Publication Data
US 2017/0005645 A1   Jan. 5, 2017

(30) Foreign Application Priority Data
Dec. 31, 2013 (FR) ...................... 13 03120

(51) Int. Cl.
*H03K 5/15* (2006.01)

(52) U.S. Cl.
CPC .......... *H03K 5/15* (2013.01); *H03K 5/15066* (2013.01); *H03K 5/15073* (2013.01)

(58) Field of Classification Search
CPC ....................................................... H03K 5/15
See application file for complete search history.

(56) References Cited

U.S. PATENT DOCUMENTS

| | | | |
|---|---|---|---|
| 5,367,204 A | 11/1994 | Mattison | |
| 5,594,376 A * | 1/1997 | McBride | ................ G01R 25/00 327/146 |
| 5,652,533 A | 7/1997 | Wong et al. | |
| 6,897,698 B1 * | 5/2005 | Gheorghiu | ............ H02M 3/158 327/231 |
| 2010/0123497 A1 | 5/2010 | Zhang et al. | |

* cited by examiner

Primary Examiner — Hai L Nguyen
(74) Attorney, Agent, or Firm — Baker & Hostetler LLP

(57) ABSTRACT

A circuit for generating at least two rectangular signals with adjustable phase shift, comprises a frequency divider circuit that receives a clock signal as input and provides a signal as output, at least two comparators that receive, respectively, a first threshold voltage and at least a second threshold voltage at one input, and a ramp signal, synchronized with the clock signal, at a second input, the at least two threshold voltages allowing the value of the phase shift between the at least two rectangular signals to be adjusted, and at least two D-type flip-flops that receive, respectively, the output signal from the first comparator and the output signal from the second comparator at their clock inputs, and the output signal from the frequency divider circuit at their D-input.

5 Claims, 4 Drawing Sheets

CIRCUIT FOR GENERATING AT LEAST TWO RECTANGULAR SIGNALS WITH ADJUSTABLE PHASE SHIFT AND USE OF SAID CIRCUIT

CROSS-REFERENCE TO RELATED APPLICATIONS

This application is a National Stage of International patent application PCT/EP2014/077723, filed on Dec. 15, 2014, which claims priority to foreign French patent application No. FR 1303120, filed on Dec. 31, 2013, the disclosures of which are incorporated by reference in their entirety.

FIELD OF THE INVENTION

The present invention relates to signal generation. The present invention more particularly relates to a circuit for generating at least two rectangular signals with adjustable phase shift. This circuit may in particular be used in a power converter of phase-shifted type.

BACKGROUND

FIG. 1 shows a circuit for generating rectangular signals with adjustable phase shift known from the prior art. The circuit comprises two comparators 11, 12 and two D-type flip-flops 13, 14. Each comparator 11, 12 receives a triangular ramp signal, provided by a signal generating device 15, at one of its comparison inputs, and a reference voltage $Vref_1$, $Vref_2$ at the other input. The output of each comparator 11, 12 is connected to a flip-flop 13, 14 that is connected as a divide-by-two frequency divider, and is active on the rising edge.

The operation of the circuit will be explained with reference to FIG. 2. The first timing diagram shows the appearance of the ramp signal. It is assumed that at time $t_0$ all of the signals are in the low state.

At time $t_1$, the value of the ramp signal $V_{rampe}$ becomes higher than the value of the first reference voltage $Vref_1$, the output signal $P_{wm1}$ of the first comparator 11 passes from the low state to the high state. This rising edge will trigger the first D-flip-flop 13 and its output signal $IP_1$ will pass to the high state.

The same phenomenon will be reproduced with the second comparator 12 and the second flip-flop 14 at time $t_2$ once the value of the ramp signal $V_{rampe}$ becomes higher than the value of the second reference voltage $Vref_2$.

At time $t_3$, the value of the ramp signal returns to zero, the output $P_{wm1}$, $P_{wm2}$ of the two comparators 13, 14 passes from the high state to the low state. As the flip-flops 13, 14 are active on the rising edge, the signals $IP_1$, $IP_2$ as output from the latter remain unchanged.

At time $t_4$, the value of the ramp signal $V_{rampe}$ once more becomes higher than the value of the first reference voltage $Vref_1$. The output of the first comparator 11 passes from the low state to the high state. This rising edge will trigger the first D-flip-flop 13 and its output signal $IP_1$ will pass from the high state to the low state.

Likewise, the output signal from the second flip-flop 14 $IP_2$ passes from the high state to the low state at time $t_5$.

A problem arises when interference occurs in the output signal from a comparator. This scenario is illustrated in FIG. 3 via an example in which an interference pulse 30 occurs in the output signal $P_{wm1\_Pb}$ of the first comparator.

In this figure, the first timing diagram shows the ramp signal. The second and third timing diagrams show, respectively, the appearance of the signal as output from the first comparator $P_{wm1\_Pb}$ and the appearance of the signal as output $IP_{1\_Pb}$ from the first D-flip-flop. The last timing diagram serves as a comparison and shows the form of the signal as output from the flip-flop in the case in which the signal as output from the comparator is not suffering from interference.

It should be noted that the rising edge of the interference triggers the flip-flop at the output of the comparator and permanently disrupts the output signal.

A problem also arises upon starting the circuit, at the moment of its power-up, as it is not known whether the flip-flops are in the high state or low state.

It is possible to force the flip-flops into the low state upon starting by virtue of the reset input of said flip-flops. However, these reset systems are random and the rise times of the reset functions are not reliable. Owing to the uncertainty of the reset, the ramp signal may, for example, start before the flip-flops are initiated. Thus, when the flip-flops are ready to start, we will find ourselves between the two rising edges and hence only one of the two rising edges will be taken into account upon starting. The two flip-flops will then be offset by 180°.

Another problem may arise if the two reset commands are not carried out at exactly the same instant.

SUMMARY OF THE INVENTION

One aim of the invention is, in particular, to remedy one or more of the drawbacks of the prior art by proposing a solution that allows problems with initiating flip-flops and interference to be overcome.

To this end, a subject of the invention is a circuit for generating at least two rectangular signals with adjustable phase shift, comprising:
  a frequency divider circuit that receives a first clock signal as input and provides a second clock signal as output;
  at least two comparators that receive, respectively, a first threshold voltage and at least a second threshold voltage at one comparison input, and a triangular ramp signal, synchronized with the clock signal, at a second comparison input, the group of at least two threshold voltages allowing the value of the phase shift between the signals of the group of at least two rectangular signals with adjustable phase shift to be adjusted;
  at least two D-type flip-flops that receive, respectively, the output signal from the first comparator and the output signal from the second comparator at their clock inputs, and the output signal from the frequency divider circuit at their D-input,
  the group of at least two rectangular signals with adjustable phase shift being available at the Q-outputs of the group of at least two D-type flip-flops.

According to one embodiment, the frequency divider circuit is a divide-by-two frequency divider.

According to one embodiment, the frequency divider circuit comprises a D-type flip-flop whose D-input is connected to the complementary Q*-output.

According to one embodiment, the circuit additionally comprises a clock circuit configured to generate a triangular ramp signal, said clock circuit receiving the clock signal as input and the output of said clock circuit being connected to one of the two comparison inputs of each comparator.

Another subject of the invention is a phase-shifted power converter comprising a circuit for generating two rectangular signals with adjustable phase shift as described above, said rectangular signals being configured to control switches of the primary and secondary bridges of said power converter.

BRIEF DESCRIPTION OF THE DRAWINGS

Other particularities and advantages of the present invention will become more clearly apparent upon reading the description which follows, given by way of non-limiting illustration and with reference to the appended drawings in which.

DETAILED DESCRIPTION

Figure 4:
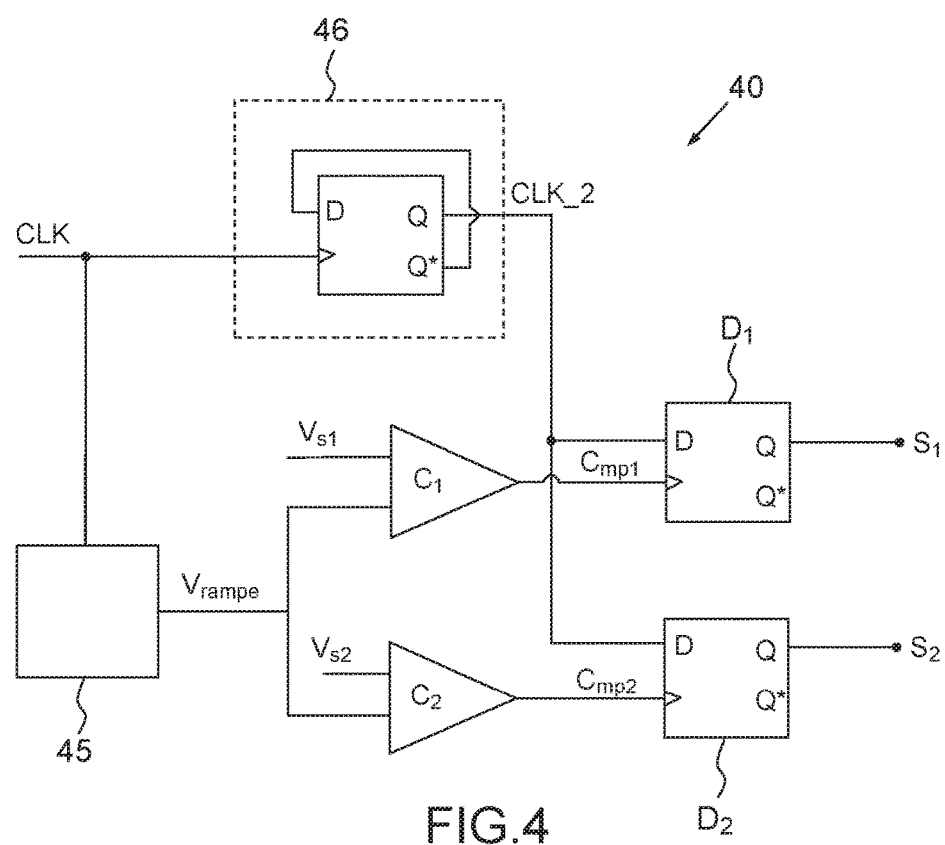
FIG. 4 shows an exemplary embodiment of a circuit for generating at least two rectangular signals with adjustable phase shift according to the invention.

FIG. 4 shows an exemplary embodiment of a circuit 40 for generating at least two rectangular signals with adjustable phase shift according to the invention. In order to simplify the explanations and so as not to overload the figures, a specific case in which the number of signals generated is equal to two is shown.

In this embodiment, the circuit comprises a frequency divider circuit 46, two comparators C1, C2 and two D-type flip-flops D1, D2.

According to one embodiment, the frequency divider circuit 46 may be a divide-by-two frequency divider circuit.

According to one embodiment, the divider circuit 46 may be implemented using a D-type flip-flop whose D-input is connected to the complementary Q*-output.

In the embodiment illustrated in FIG. 4, the frequency divider circuit 46 receives a first clock signal CLK as input and provides a second clock signal CLK_2 as output.

The first comparator C1 receives, at one of its comparison inputs, a first signal $Vs_1$ and, at the second input, a triangular ramp signal $V_{rampe}$.

The second comparator C2 receives, at one of its comparison inputs, a second signal $Vs_2$ and, at the second input, the same triangular signal $V_{rampe}$ as above.

Both signals $Vs_1$ and $Vs_2$ are analog voltages allowing the phase shift between the two rectangular signals with adjustable phase shift to be defined.

The triangular ramp signal is synchronized with the first clock signal CLK of the frequency divider circuit 46. The first clock signal CLK may be used to generate the ramp signal.

According to one embodiment, the circuit 40 for generating at least two rectangular signals $S_1$, $S_2$ with adjustable phase shift may comprise a clock circuit 45 that is configured to generate a triangular ramp signal $V_{rampe}$. The clock circuit 45 may receive the first clock signal CLK as input and provide the triangular signal $V_{rampe}$ as output for the comparators C1 and C2. In order to do this, the output of the clock circuit 45 may be connected to one of the two comparison inputs of each comparator C1, C2.

The triangular signal $V_{rampe}$ allows the possible range of variation in the phase shift between the two output signals to be defined. According to the duty cycle of the ramp signal, this range may extend up to 180°.

The circuit according to one embodiment of the invention may also comprise two D-type flip-flops. These flip-flops may be active on the rising or falling edge.

The first flip-flop D1 receives, at its clock input, the output signal Cmp1 from the first comparator C1 and the second flip-flop D2 receives the output signal Cmp2 from the second comparator C2. The output signal CLK_2 from the frequency divider circuit 46 is sent to the D-input of each of the flip-flops D1 and D2.

Figure 5:
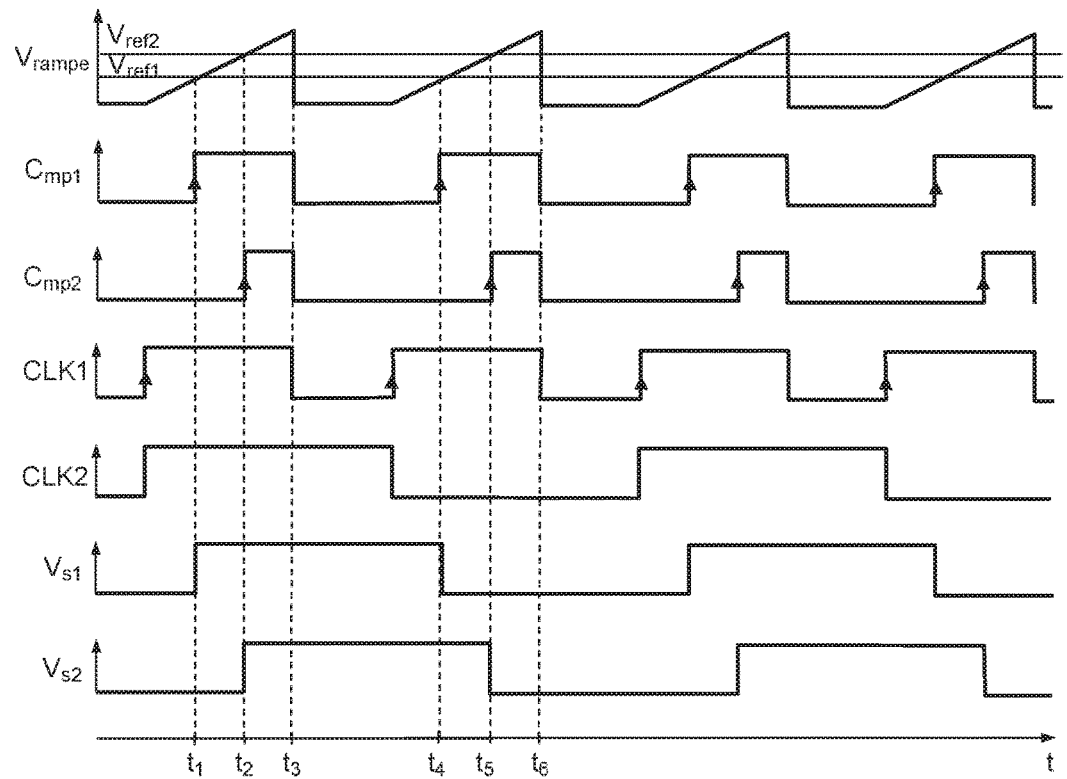
FIG. 5 shows examples of the appearance of the signals at various points in the circuit of FIG. 4.

The operation of the circuit will now be explained with the aid of the exemplary timing diagrams of FIG. 5.

The first timing diagram corresponds to the ramp signal $V_{rampe}$. The next two timing diagrams show the signals as output from the first and second comparators C1, C2, respectively. The fourth and fifth timing diagrams illustrate the first clock signal CLK as input to the frequency divider circuit 46 and the output signal CLK_2 from said divider, respectively. The first clock signal CLK is synchronized with the ramp signal and the frequency of the output signal CLK_2 is divided by two with respect to the input signal CLK of the frequency divider circuit 46. The last two timing diagrams show the signals as output from the two flip-flops D1, D2.

At time $t_1$, the value of the ramp signal becomes higher than the value of the first threshold voltage $V_{S1}$, the output signal from the first comparator C1 passes from the low state to the high state. The first flip-flop D1 detects the rising edge and reproduces, as output, the value of the second clock signal CLK_2, namely a high state, the signal as output from the flip-flop D1 therefore passes from the low state to the high state.

At time $t_2$, the value of the ramp signal becomes higher than the value of the second threshold voltage $V_{S2}$. The output signal from the second comparator C2 therefore passes from the low state to the high state. The second flip-flop D2 is triggered and its output signal takes the same value as the second clock signal CLK_2, namely a high state.

At time $t_3$, the value of the ramp signal returns to zero, the output signals from the two comparators C1, C2 pass from the high state to the low state.

At time $t_4$, the value of the ramp signal once more becomes higher than the value of the first threshold voltage $V_{S1}$, the output signal from the first comparator C1 passes to the high state and triggers the first flip-flop D1 which reproduces the value of the second clock signal CLK_2 as output. Its output signal passes from the high state to the low state.

Likewise, at time $t_5$, as the value of the ramp signal becomes higher than the value of the second threshold voltage $V_{S2}$ it triggers a rising edge as output from the second comparator C2. This rising edge triggers the second flip-flop D2 and its output signal passes from the high state to the low state.

Thus, two rectangular clock signals that are phase-shifted in time are obtained as output from the circuit 40. The phase shift between the two signals may be adjusted by modifying the value of the two threshold voltages $V_{S1}$ et $V_{S2}$. As shown above, the range of variation in the phase shift depends on the duty cycle of the ramp signal.

Of course, this circuit 40 may be generalized to a number of rectangular signals that is greater than two. For a number n of rectangular signals phase-shifted in time, where n represents an integer that is greater than one, the circuit will comprise n comparators and n D-type flip-flops and will receive n threshold voltages as input.

Figure 6:
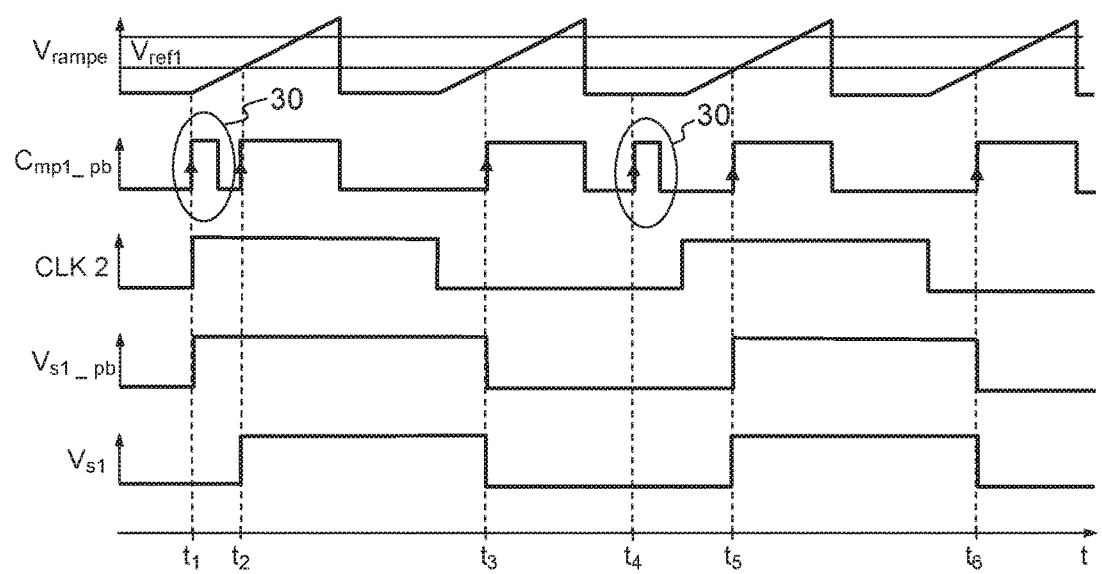
FIG. 6 shows examples of the appearance of the signals at various points in the circuit of FIG. 4 when interference occurs.

FIG. 6 illustrates, with exemplary timing diagrams, the case in which interference 30 occurs in the output signal Cmp1_Pb from the first comparator C1 of the circuit 40 of FIG. 4. In this figure, a ramp signal, the signal as output from the first comparator C1, an output signal CLK_2 from the frequency divider circuit 46, an output signal from the second flip-flop D2 and an output signal from the second flip-flop D2 in the case without interference are shown, respectively.

It is assumed that an interference signal 30 occurs at time $t_1$ in the output signal from the first comparator C1. The rising edge of this interference 30 triggers the flip-flop D1 which reproduces the value of the second clock signal CLK_2, namely a high state. The output signal $S_{1\_Pb}$ from the flip-flop D1 therefore changes state at time $t_1$ instead of time $t_2$.

Figure 1:
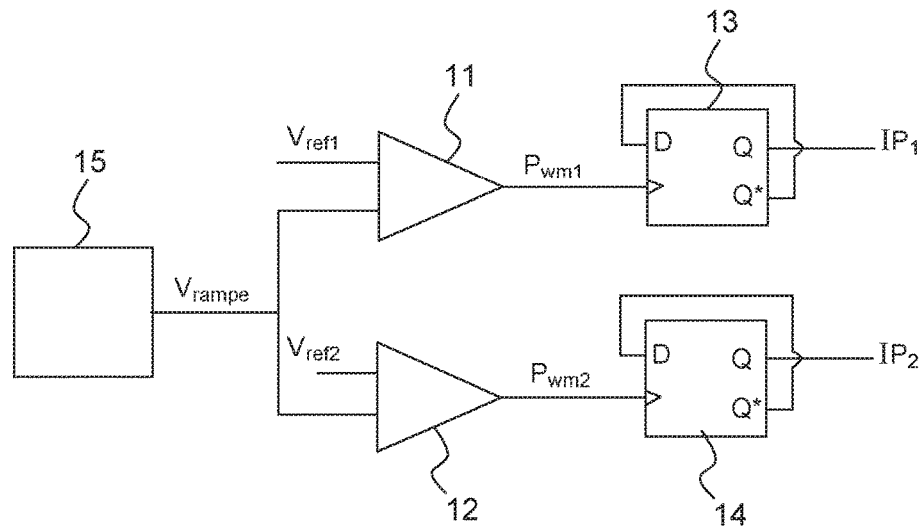
FIG. 1, described above, shows a circuit for generating at least two rectangular signals with adjustable phase shift known from the prior art.
Figure 2:
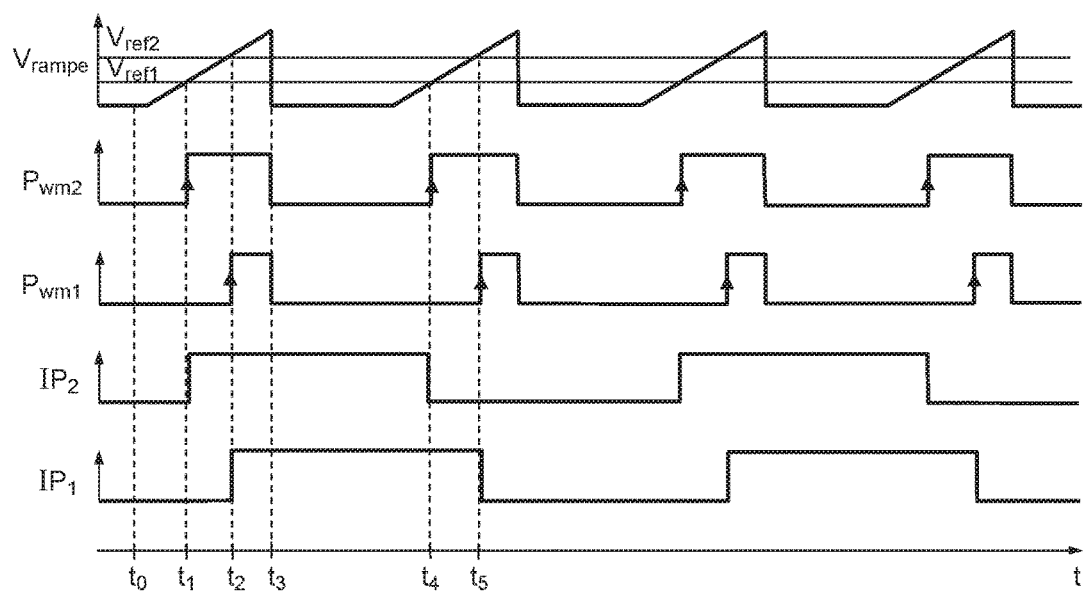
FIG. 2, described above, shows the appearance of the signals at various points in the circuit of FIG. 1.
Figure 3:
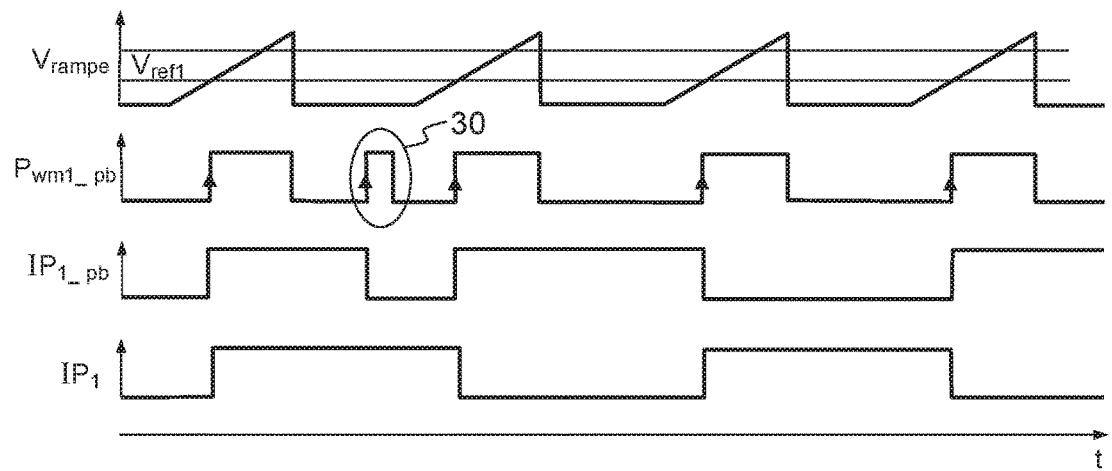
FIG. 3, described above, shows the appearance of the signals at various points in the circuit of FIG. 1 in a particular scenario.

At time $t_2$, the output signal from the comparator C1 has a rising edge once again. By detecting this rising edge, the flip-flop D1 reproduces the signal CLK_2 and remains in the high state. In contrast to the case of the circuit shown in FIG. 1, the output signal $S_{1\_Pb}$ does not change state on each rising edge that is present in the output signal from the comparator. Likewise, it may be noted that the output signal $S_{1\_Pb}$ is not disrupted definitively, but only temporarily. The rising edge following the interference signal 30 allows the flip-flop output signal $S_1$ to be brought back to its normal level, i.e. to the logic state that it would have had if it there had not been any interference 30 in the output signal from the comparator C1.

It may also be noted that depending on the instant at which the interference signal 30 occurs, it is possible that the latter not disrupt the signal output from the flip-flop. For example, the interference signal at instant $t_4$ has no effect on the output signal $S_1$.

Figure 7:
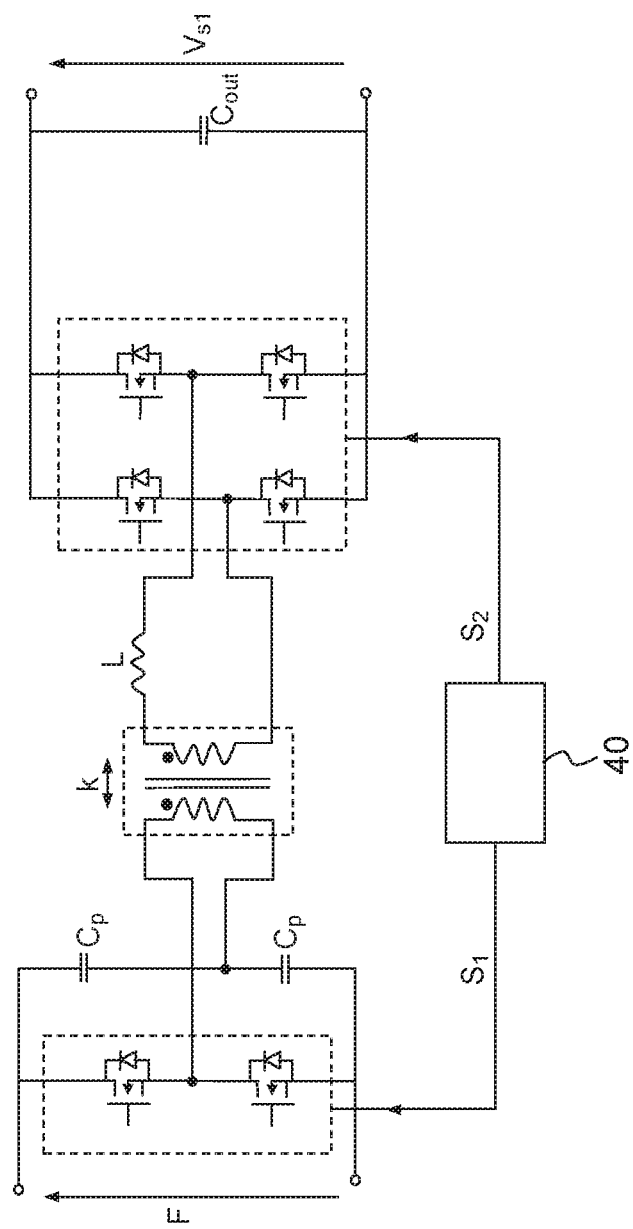
FIG. 7 shows an exemplary embodiment of a phase-shifted power converter wherein the control signals of the switches of the DC/AC and AC/DC converters are phase-shifted using a circuit for generating at least two rectangular signals with adjustable phase shift according to one embodiment of the invention.

According to a wholly non-limiting example, this circuit may be applicable in a phase-shifted power converter. By way of illustration, FIG. 7 shows an exemplary embodiment of a phase-shifted power converter wherein a phase shift between the primary and secondary bridge legs is produced using a circuit 40 for generating at least two rectangular signals with adjustable phase shift according to one embodiment of the invention. In this circuit, the output signals $S_1$, $S_2$ from the circuit 40 for generating rectangular signals with adjustable phase shift are configured to control the various switches of the primary and secondary bridges of the power converter.

Advantageously, the signal generation circuit according to the invention allows problems with synchronizing flip-flops, as well as problems linked to resetting flip-flops, to be overcome.

This circuit also allows the consequences of one or more interference pulses to be minimized.

The invention claimed is:

1. A circuit for generating at least two rectangular signals with adjustable phase shift, comprising:
    a frequency divider circuit that receives a first clock signal as input and provides a second clock signal as output;
    at least two comparators that receive, respectively, a first threshold voltage and at least a second threshold voltage at one comparison input, and a triangular ramp signal, synchronized with the first clock signal, at a second comparison input, the group of at least two threshold voltages allowing the value of the phase shift between the signals of the group of at least two rectangular signals with adjustable phase shift to be adjusted;
    at least two D-type flip-flops that receive, respectively, the output signal from the first comparator and the output signal from the second comparator at their clock inputs, and the output signal from the frequency divider circuit at their D-input,
    the group of at least two rectangular signals with adjustable phase shift being available at the Q-outputs of the group of at least two D-type flip-flops.

2. The circuit as claimed in claim 1, wherein the frequency divider circuit is a divide-by-two frequency divider.

3. The circuit as claimed in claim 1, wherein the frequency divider circuit comprises a D-type flip-flop whose D-input is connected to the complementary Q*-output.

4. The circuit as claimed in claim 1, additionally comprising a clock circuit configured to generate a triangular ramp signal, said clock circuit receiving the clock signal as input and the output of said clock circuit being connected to one of the two comparison inputs of each comparator.

5. A phase-shifted power converter, comprising a circuit for generating two rectangular signals with adjustable phase shift as claimed in claim 1, said rectangular signals being configured to control switches of the primary and secondary bridges of said power converter.

* * * * *